United States Patent
Anderson et al.

(10) Patent No.: US 10,935,614 B2
(45) Date of Patent: Mar. 2, 2021

(54) SYSTEMS, DEVICES AND METHODS FOR WIRELESS TRANSMISSION OF SIGNALS THROUGH A FARADAY CAGE

(71) Applicant: INNOVERE MEDICAL INC., Markham (CA)

(72) Inventors: Kevan Anderson, Cobourg (CA); Garry Liu, Toronto (CA)

(73) Assignee: INNOVERE MEDICAL INC., Oshawa (CA)

( * ) Notice: Subject to any disclaimer, the term of this patent is extended or adjusted under 35 U.S.C. 154(b) by 0 days.

(21) Appl. No.: 16/806,140

(22) Filed: Mar. 2, 2020

(65) Prior Publication Data

US 2020/0200846 A1    Jun. 25, 2020

Related U.S. Application Data

(63) Continuation of application No. 15/780,755, filed as application No. PCT/CA2016/051417 on Dec. 2, 2016, now Pat. No. 10,578,689.

(60) Provisional application No. 62/262,803, filed on Dec. 3, 2015.

(51) Int. Cl.
| | |
|---|---|
| H04B 1/38 | (2015.01) |
| G01R 33/36 | (2006.01) |
| G01R 33/422 | (2006.01) |
| H01P 3/06 | (2006.01) |
| H01P 5/02 | (2006.01) |
| H01Q 1/50 | (2006.01) |
| H04B 1/40 | (2015.01) |
| G01R 33/28 | (2006.01) |

(52) U.S. Cl.
CPC ....... *G01R 33/3692* (2013.01); *G01R 33/422* (2013.01); *H01P 3/06* (2013.01); *H01P 5/02* (2013.01); *H01Q 1/50* (2013.01); *H04B 1/40* (2013.01); *G01R 33/283* (2013.01)

(58) Field of Classification Search
CPC .... H04B 1/40; G01R 33/283; G01R 33/3453; G01R 33/3692; G01R 33/422; H01P 3/06; H01P 5/02; H01P 5/12
See application file for complete search history.

(56) References Cited

U.S. PATENT DOCUMENTS

| | | | |
|---|---|---|---|
| 9,331,371 B2* | 5/2016 | Shijo | G01S 13/06 |
| 9,625,545 B2* | 4/2017 | Dumoulin | A61B 5/055 |
| 2005/0107681 A1* | 5/2005 | Griffiths | G01R 33/567 |
| | | | 600/410 |
| 2017/0220995 A1* | 8/2017 | Paulweber | G06K 7/10297 |

* cited by examiner

Primary Examiner — Nhan T Le

(57) ABSTRACT

Embodiments of the present disclosure provide devices and systems that support wireless communication between wireless communication devices residing within, and external to, a Faraday cage. In some embodiments, devices and systems are provided for transmitting wireless signals through a waveguide port of a Faraday cage for wireless signals having frequencies below the cutoff frequency of the waveguide port, where a portion of the waveguide port is compromised by the presence of a conductor, thereby permitting the propagation of electromagnetic waves. In some embodiments, aspects of the present disclosure are employed to adapt a magnetic resonance imaging system for communications between a scanner room and a control room.

9 Claims, 8 Drawing Sheets

SYSTEMS, DEVICES AND METHODS FOR WIRELESS TRANSMISSION OF SIGNALS THROUGH A FARADAY CAGE

CROSS-REFERENCE TO RELATED APPLICATION

This application claims priority to U.S. Provisional Application No. 62/262,803, titled "SYSTEMS, DEVICES AND METHODS FOR WIRELESS TRANSMISSION OF SIGNALS THROUGH A FARADAY CAGE" and filed on Dec. 3, 2015, the entire contents of which is incorporated herein by reference.

BACKGROUND

The present disclosure relates to electromagnetically shielded environments. More particularly, the present disclosure relates to magnetic resonance imaging systems.

The use of magnetic resonance (MR) imaging has expanded from diagnostic imaging to include the guidance of a variety of interventions. These include, MR-guided biopsies, and ablation therapies performed by both radiofrequency (RF) energy and high-intensity focused ultrasound.

Many diagnostic and interventional procedures require or are aided by the presence of a clinician, staff or family members inside the Faraday cage. The purpose of the Faraday cage is to block any electromagnetic energy within the operating bandwidth of the MR scanner (typically 64 MHz+/−250 kHz for a 1.5 T system and 128 MHz+/−250 kHz for a 3T system). This eliminates outside interference with the scanner and preserves image quality.

It is often desirable for people inside the Faraday cage to communicate with people outside of the Faraday cage; this is particularly true in the case of interventional procedures. In addition to the need for communication, peripheral devices that enable the visualization of images and the interactive control of the MR scanner are also desirable.

Currently, there are wired solutions that enable communication between the control room and the scanner room, however, the presence of wires in either room attached to individuals can be very cumbersome, especially when a clinical procedure is taking place and people are required to move around the room. Communication with someone inside a scanner room is further hindered by the loud noises generated by the MR scanner.

Wireless technologies are beneficial in that they reduce the clutter caused by numerous wired peripheral devices. In an MR suite, however, wireless signals originating from inside the scan room are unable to reach the adjacent control room due to the Faraday cage. Similarly, the Faraday cage also prevents wireless signals originating from the control room to propagate into the scanning room.

SUMMARY

Embodiments of the present disclosure provide devices and systems that support wireless communication between wireless communication devices residing within, and external to, a Faraday cage. In some embodiments, devices and systems are provided for transmitting wireless signals through a waveguide port of a Faraday cage for wireless signals having frequencies below the cutoff frequency of the waveguide port, where a portion of the waveguide port is compromised by the presence of a conductor, thereby permitting the propagation of electromagnetic waves. In some embodiments, aspects of the present disclosure are employed to adapt a magnetic resonance imaging system for communications between a scanner room and a control room.

In a first aspect, there is provided a wireless communication system for communicating through a waveguide port of a Faraday cage, the wireless communications system comprising:

one or more internal wireless communication devices located within the Faraday cage, and one or more external wireless communication devices located external to the Faraday cage, wherein said one or more internal wireless communication devices and said one or more external wireless communication devices are configured for wireless communication within a frequency band that lies, at least in part, below a cutoff frequency of said waveguide port; and a wireless bridge device comprising an antenna and a transceiver operably connected to said antenna, wherein at least a portion of said wireless bridge device is housed within said waveguide port, such that said antenna resides within said waveguide port;

wherein a conductive path is provided within a first longitudinal portion of said waveguide port, wherein said first longitudinal portion extends between a first side of said waveguide port and an intermediate location within said waveguide port, and wherein said conductive path is unshielded and resides within said first longitudinal portion without making electrical contact with said Faraday cage, such that the propagation of electromagnetic waves is supported within said first longitudinal portion of said waveguide port, and wherein a second longitudinal portion of said waveguide port is absent of said conductive path, said second longitudinal portion extending between said intermediate location and a second side of said waveguide port, such that electromagnetic waves having a frequency below the cutoff frequency are attenuated within said second longitudinal portion, thereby preserving the functionality of said waveguide port as a high-pass filter; and wherein said antenna resides within said waveguide port at an antenna location that is sufficiently close to said second side of said waveguide port to support the transmission and reception of wireless signals to and from said one or more internal wireless communication devices, and wherein said first longitudinal portion is of sufficient length to support the transmission and reception of wireless signals to and from said one or more external wireless communications devices.

In another aspect, there is provided a wireless communication system for communicating through a waveguide port of a Faraday cage, the wireless communications system comprising:

one or more internal wireless communication devices located within the Faraday cage, and one or more external wireless communication devices located external to the Faraday cage, wherein said one or more internal wireless communication devices and said one or more external wireless communication devices are configured for wireless communication within a frequency band that lies above a cutoff frequency of said waveguide port; and a wireless bridge device comprising an antenna and a transceiver operably connected to said antenna, wherein at least a portion of said wireless bridge device is housed within said waveguide port, such that said antenna resides within said waveguide port;

wherein said antenna resides within said waveguide port at an antenna location that is suitable for to support the transmission and reception of wireless signals to and from said one or more internal wireless communication devices and to and from said one or more external wireless communications devices.

In another aspect, there is provided a wireless communication system for communicating through a waveguide port of a Faraday cage, the wireless communications system comprising:

one or more internal wireless communication devices located within the Faraday cage, and one or more external wireless communication devices located external to the Faraday cage; and a wireless bridge device comprising an antenna and a transceiver operably connected to said antenna, wherein at least a portion of said wireless bridge device is housed within said waveguide port, such that said antenna resides within said waveguide port;

wherein a conductive path is provided within a first longitudinal portion of said waveguide port, wherein said first longitudinal portion extends between a first side of said waveguide port and an intermediate location within said waveguide port, and wherein said conductive path is unshielded and resides within said first longitudinal portion without making electrical contact with said Faraday cage, such that the propagation of electromagnetic waves is supported within said first longitudinal portion of said waveguide port, and wherein a second longitudinal portion of said waveguide port is absent of said conductive path, said second longitudinal portion extending between said intermediate location and a second side of said waveguide port, such that electromagnetic waves having a frequency below a cutoff frequency of said waveguide port are attenuated within said second longitudinal portion, thereby preserving the functionality of said waveguide port as a high-pass filter; and wherein said antenna resides within said waveguide port at an antenna location that is sufficiently close to said second side of said waveguide port to support the transmission and reception of wireless signals to and from said one or more internal wireless communication devices, and wherein said first longitudinal portion is of sufficiently length to support the transmission and reception of wireless signals to and from said one or more external wireless communications devices.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which.

DETAILED DESCRIPTION

Figure 1:
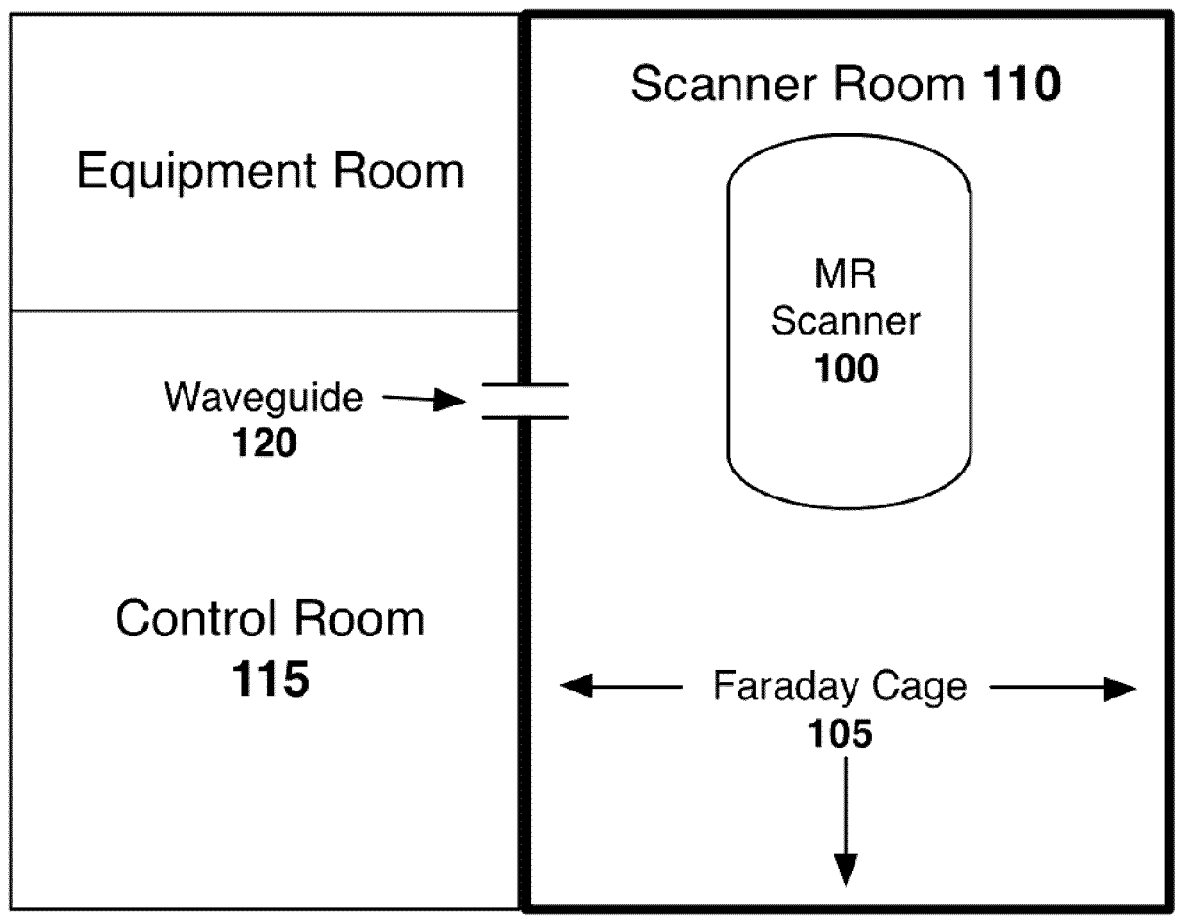
FIG. 1 is a schematic diagram of a typical magnetic resonance imaging suite, comprising a magnetic resonance imaging scanner, magnet (scanning) room, control room, Faraday cage, and a waveguide port.

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. Unless otherwise specified, the terms "about" and "approximately" mean plus or minus 25 percent or less.

It is to be understood that unless otherwise specified, any specified range or group is as a shorthand way of referring to each and every member of a range or group individually, as well as each and every possible sub-range or sub-group encompassed therein and similarly with respect to any sub-ranges or sub-groups therein. Unless otherwise specified, the present disclosure relates to and explicitly incorporates each and every specific member and combination of sub-ranges or sub-groups.

As used herein, the term "on the order of", when used in conjunction with a quantity or parameter, refers to a range spanning approximately one tenth to ten times the stated quantity or parameter.

Unless defined otherwise, all technical and scientific terms used herein are intended to have the same meaning as commonly understood to one of ordinary skill in the art. Unless otherwise indicated, such as through context, as used herein, the following terms are intended to have the following meanings:

As used herein, the phrase "Faraday cage" refers to an enclosure formed from a conductive material, such that electromagnetic waves are prevented from passing into or out the enclosed volume. In some embodiments, a Faraday cage may be formed from a solid conductive material, while in other embodiments, a Faraday cage may be formed from a conductive mesh. A "Faraday cage" may also be referred to as a "Faraday shield" or a "Faraday screen".

As used herein, the terms "waveguide port" and "waveguide channel" refers to a hollow conductive structure penetrating a Faraday cage, where the hollow conductive structure is configured to act as a high-pass filter. In some embodiments, the waveguide port may have a size that is suitable for moving items into or out of a Faraday cage.

As used herein, the phrases "in electrical contact" and "in electrical communication" refer to two or more conductors having substantially the same electrical potential due to direct or indirect electrical contact between the conductors.

Embodiments of the present disclosure provide devices and systems that support wireless communication between wireless communication devices residing within, and external to, a Faraday cage. In some embodiments, devices and systems are provided for transmitting wireless signals through a waveguide port of a Faraday cage for wireless signals having frequencies below the cutoff frequency of the waveguide port. In some embodiments, aspects of the present disclosure are employed to adapt a magnetic resonance imaging system for communications between a magnet (scanner) room and a control room.

With reference to FIG. 1, a conventional magnetic resonance system is illustrated. MR scanner 100 is situated in magnet (scanner) room 110, which is surrounded by a Faraday cage 105. Faraday cage 105 is an enclosure formed with conducting material (either in solid or mesh form). Such an enclosure attenuates ambient RF signals and prevents them from entering the MR scanner room. Faraday cage 105 is often located within the walls and windows of MR scanner room 110. Much of the controlling and operation of MR scanner 100 occurs in adjacent control room 115.

As shown in FIG. 1, a waveguide port 120 is provided within Faraday cage 105. Waveguide port 120 is a conductive passage that is electrically connected to Faraday cage 105, and forms an opening through Faraday cage 105. Waveguide port 120 has dimensions that are selected such it acts as a high pass filter to electromagnetic waves, with a cutoff frequency well above the operational frequency of MR scanner 100. As a result, MR image quality is not compromised by the presence of waveguide port 120. Waveguide port 120 may be employed, for example, to permit the passage of non-conductive materials, such as anaesthesia tubes, between scanner room 110 and control room 115. In one non-limiting embodiment, an example waveguide port may be a substantially cylindrical tube, formed from a conductive material, with a diameter of approximately 10 cm and a length of approximately 30 cm.

For any conducting hollow guide, including those that are circular or rectangular in cross section, the electric potential of the interior of the conductor is a constant. The consequence of this is that, according to the wave equation, the only electromagnetic propagation modes that are able to exist are the transverse magnetic (TM) or transverse electric (TE) modes. Both of these propagation modes have distinct cutoff frequencies whereby only electromagnetic waves above the cutoff frequency are able to propagate through the hollow guide.

The problems associated with the transmission of electrical signals through a waveguide port are described in Patent Cooperation Treaty Patent Application No. PCT/CA2014/050086, titled "SYSTEMS, DEVICES AND METHODS FOR TRANSMITTING ELECTRICAL SIGNALS THROUGH A FARADAY CAGE". The various embodiments of Patent Cooperation Treaty Patent Application No. PCT/CA2014/050086 involve the use of a wired signal path within the waveguide port, while preserve the operation of the waveguide port as a high-pass filter by ensuring that an unscreened conductors residing within the waveguide port are in electrical communication with the waveguide port.

Specifically, Patent Cooperation Treaty Patent Application No. PCT/CA2014/050086 teaches that "in order to pass a conductor through the hollow guide while maintaining the inability for TEM propagation modes to exist, it is necessary for conductors in the waveguide to be at the same potential as the interior surface of the hollow guide (i.e. be equipotential with the interior surface of the hollow guide)." Patent Cooperation Treaty Patent Application No. PCT/CA2014/050086 therefore teaches that a wired signal path is required for an electrical signal to traverse the waveguide port, where the wired signal path is shielded by an outer conductor that is in electrical communication with the waveguide port. The electrical contact of the outer conductor maintains the operation of the open portion of the waveguide as a high pass filter.

Many of the example embodiments disclosed by Patent Cooperation Treaty Patent Application No. PCT/CA2014/050086 may be disadvantageous in that wired connections for delivering signals across the waveguide port are required on at least one side of the waveguide insert. Only the embodiment shown in FIG. 16 of Patent Cooperation Treaty Patent Application No. PCT/CA2014/050086 discloses a wireless device that avoids the need for a wired connection from the magnet room or the control room. Unfortunately, such a device is costly and complex, as separate antennas are required on both sides of the waveguide port, and where the electrical signal traverses the waveguide port over a wire that is shielded by an outer conductor, where the outer conductor is in electrical contact with the waveguide port.

The present inventors therefore endeavored to address this problem in order to provide a solution that was less costly, less complex, and did not require the use of a grounded waveguide insert in order to achieve signal transmission at frequencies below the cutoff frequency of the waveguide port. Accordingly, in contrast to the teachings of Patent Cooperation Treaty Patent Application No. PCT/CA2014/050086, various example embodiments of the present disclosure provide wireless communication systems that do not require separate antennas on each side of the waveguide port for wireless operation, do not require the use of a shielded conductive path for the electrical signal to traverse the waveguide port, and instead employ the use of an internal conductive path to partially compromise the waveguide in order to support the propagation of electromagnetic waves within a longitudinal portion of the waveguide port.

Figure 2:
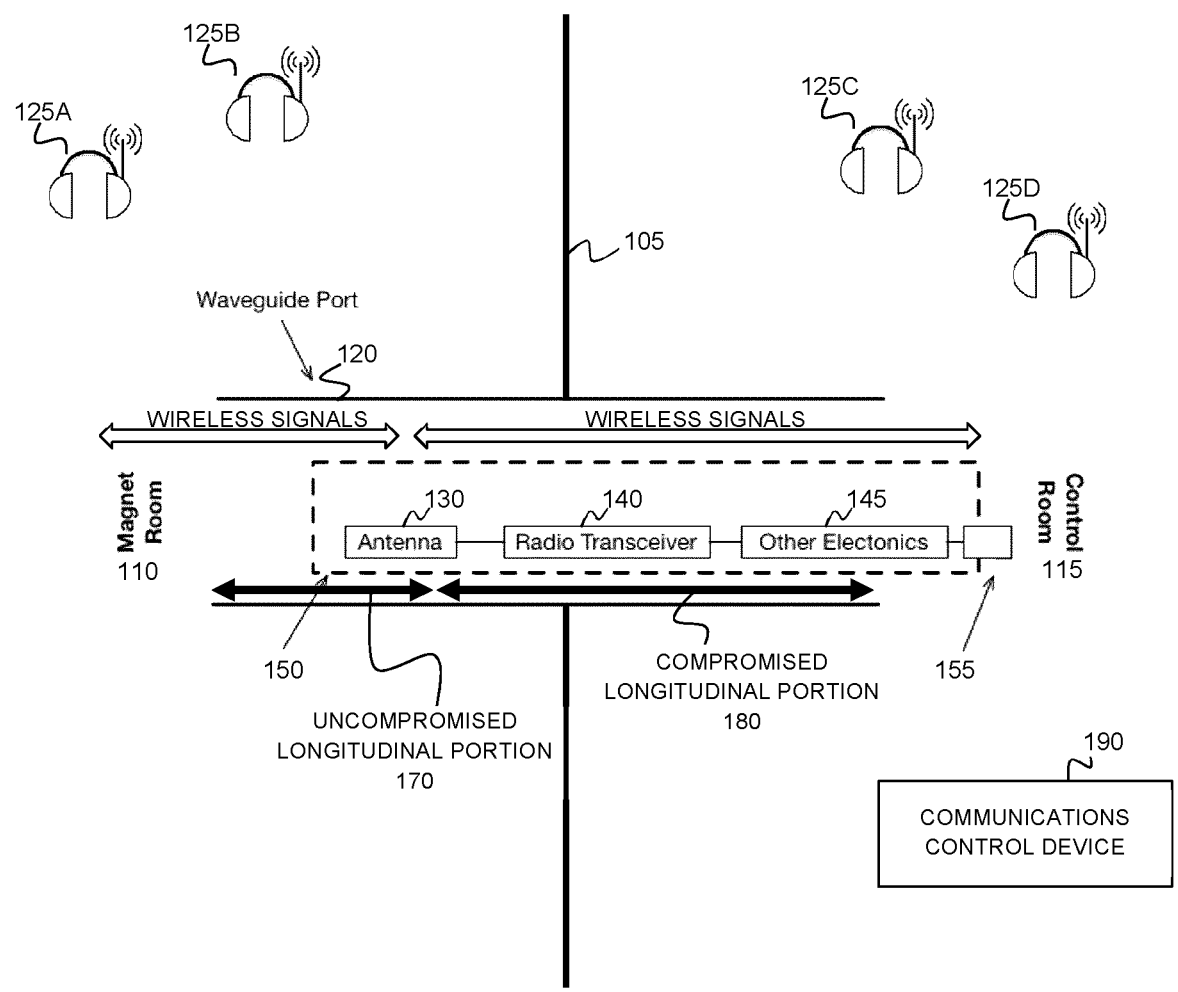
FIG. 2 is an illustration of an example system including a wireless bridge device housed within a waveguide port, in which a longitudinal portion of the waveguide port is compromised by the presence of a conductive path, such that the propagation of electromagnetic waves below the cutoff frequency of the waveguide is possible within the compromised portion, while the remainder of the waveguide attenuates the propagation of electromagnetic waves having a frequency below the cutoff frequency.

Referring now to FIG. 2A, an example system is shown for enabling wireless communication through a waveguide port of a Faraday cage. In this example system, a wireless bridge device 150 is provided to facilitate communication between one or more internal wireless audio communications devices 125A-B that reside within the Faraday cage 105 and one or more external wireless audio communications devices 125C-D. The wireless audio communications devices 125A-D transmit and receive wireless signals in order to communicate audio signals therebetween, and the wireless bridge device 150 is employed to receive the various wireless signals from the internal and external wireless communications devices 125A-D, perform optional signal routing and mixing, and rebroadcast the audio signals into both the magnet room 110 and the control room 115, acting as a wireless bridge between the wireless communications devices inside and out of the Faraday cage 105. The wireless broadcast device 150 is shown including at least one antenna 130, at least one radio transceiver 140, one or more optional additional electronic components 145, and a power source or power connector 155. The wireless broadcast device 150 is housed, at least partially, within the waveguide port 120, such that the antenna 130 resides within the waveguide port 120.

As shown in the figure, the antenna 130 of the wireless broadcast device 150 is located within the waveguide port 120 at a location that is sufficient close to the magnet room 110 to support the transmission and reception of wireless signals to and from the internal wireless communications devices 125A-B, even though this portion of the waveguide port, shown as uncompromised longitudinal portion 170, acts as a high-pass filter causes some attenuation of the propagation of electromagnetic waves. If the antenna 130 is located sufficiently close to the magnet room side of the waveguide port 120, the attenuation will be sufficiently low that the transmission and reception of wireless signals to and from the internal wireless communication devices will be feasible.

For example, many circular waveguides used in magnetic resonance systems have a diameter of 2 inches. The cutoff frequency that corresponds to this diameter is 3.46 GHz, which prevents the propagation, within the waveguide, of wireless signals having frequencies in the 2.4-2.5 GHz range. However, if the antenna 130 is located sufficiently close to the magnet room side of the waveguide port, electromagnetic waves will be able to propagate from the magnet room to the antenna, and from the antenna to the magnet room, without appreciable attenuation, thereby supporting wireless communication between the internal communication devices 125A-B and the antenna 130. For example, in the case of waveguides having a diameter of two inches, it has been found that signal transmission and reception for frequencies in the 2.4-2.5 GHz range is feasible when the antenna is positioned within 5 centimeters of the magnet room side of the waveguide port.

The positioning of the antenna 130 relative to the magnet room side of the waveguide port supports wireless transmission and reception between the internal wireless communications devices 125A-B and the wireless broadcast device 150, but does not alone facilitate the transmission and reception of wireless signals from the external wireless communications device 125C-D to and from the antenna 130. As shown in the example embodiment illustrated in FIG. 2A, in order to facilitate the transmission and reception of wireless signals from the external wireless communications device 125C-D to and from the antenna 130, a longitudinal portion of the waveguide 180 is compromised (breached) by the presence of an unshielded conductive path that resides within the waveguide port 120 without making electrical contact with the waveguide port or Faraday cage. The presence of the conductive path supports or permits (e.g. via the presence of additional modes) the propagation of electromagnetic waves within waveguide port 120. The extent of the conductive path (and thus the longitudinal portion 180) is select to enable the transmission and reception of wireless signals to and from the external communications device 125C-D to the antenna 130. In some embodiments, the electrical conductive path is continuous within the compromised longitudinal portion of the waveguide. The electrically conductive path that causes the longitudinal portion of the waveguide port to be compromised to allow the propagation of electromagnetic waves can take on many different forms, and several non-limiting examples are provided below.

According to the example embodiment described above, the antenna 130 resides within the waveguide port at a location that is sufficiently close to the magnet room side of the waveguide port to support the transmission and reception of wireless signals to and from the internal wireless communication devices, and the compromised longitudinal portion of the waveguide port is of sufficiently length to support the transmission and reception of wireless signals to and from the external wireless communications devices. The sufficiency of the proximity of the antenna to the magnet room side of the waveguide port, and the sufficiency of the length of the compromised longitudinal portion, may be determined according to several different criteria. It will be understood that the criteria may depend on aspects of the system such as the diameter and length of the waveguide port, the wireless frequencies, the transmitted power of the wireless signals, and the sensitivity of the transceivers.

For example, the sufficiency may be determined based on the signal-to-noise ratio of the wireless signals that are received by the wireless bridge device and/or the wireless communication devices. In some example implementations, the proximity of the antenna to the magnet room side of the waveguide port, and the length of the compromised longitudinal portion, may be selected to provide a signal-to-noise ratio of at least 1 dB, at least 2 dB, at least 3 dB, or more.

According to another example, the sufficiency may be determined based on the propagation loss, within the waveguide port, experienced by the wireless signals that are received by the wireless bridge device and/or the wireless communication devices. In some example implementations, the proximity of the antenna to the magnet room side of the waveguide port, and the length of the compromised longitudinal portion, may be selected such that the signal loss due propagation within the waveguide port is less than 1 dB, less than 2 dB, less than 3 dB, less than 5 dB, or less than 10 dB.

Figure 3A:
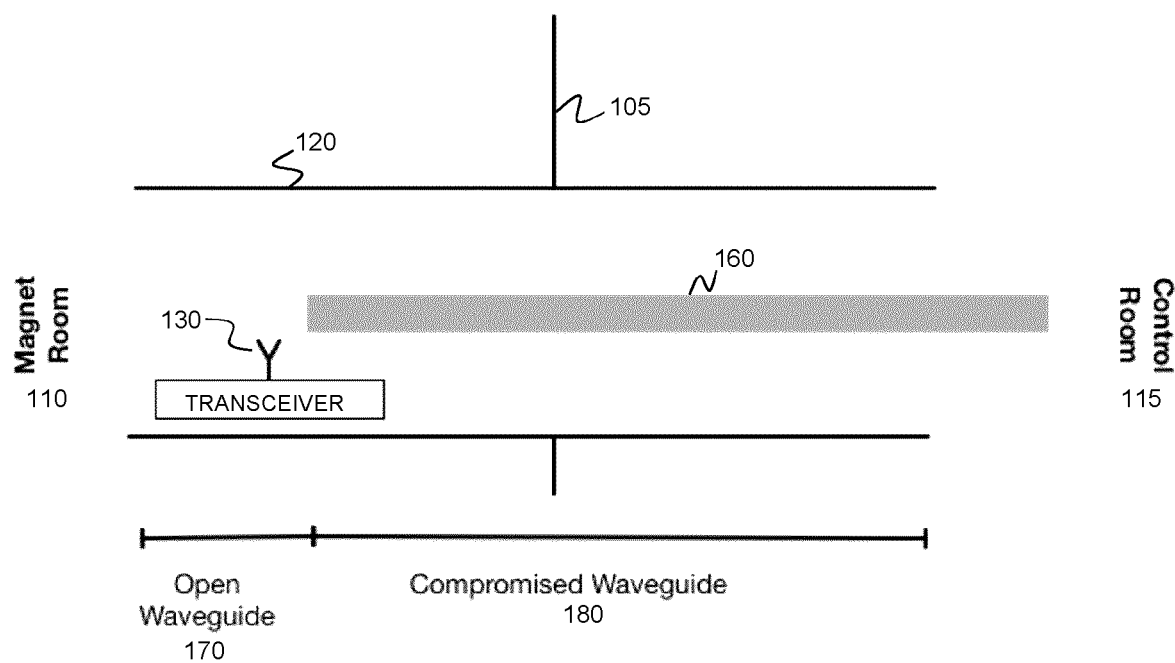
FIGS. 3A and 3B show example embodiments for the positioning of the antenna relative to the compromised portion of the waveguide port.
Figure 3B:
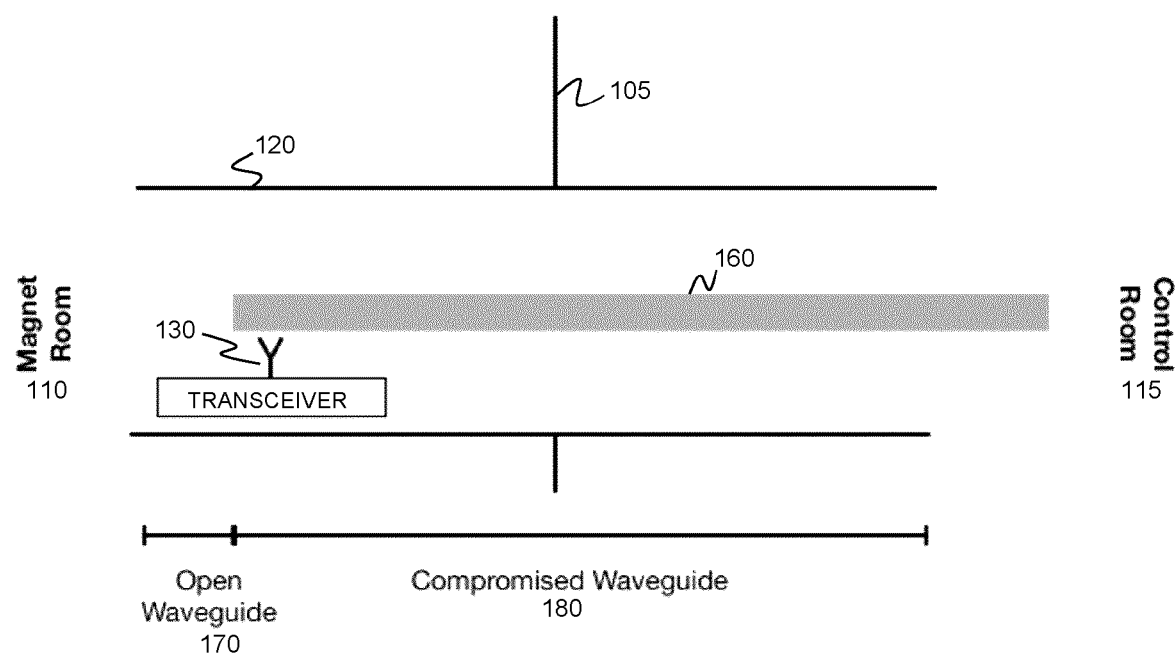

FIGS. 3A and 3B illustrate two example embodiments with different locations of the antenna 130 relative to the compromised longitudinal portion 180 of the waveguide port 120, where the compromised portion 180 is shown including unshielded conductor 160 that is free from electrical contact with the waveguide port 120. In FIG. 3A, the antenna is located within the uncompromised longitudinal portion 170 of the waveguide port, while FIG. 3B illustrates an alternative example embodiment in which the antenna 130 is located within the compromised longitudinal portion 180 of the waveguide port.

The configuration shown in FIG. 3A may be advantageous in that the wireless signals transmitted to or received from the magnet room side of the waveguide, and wireless signals transmitted to or received from the control room side of the waveguide, each traverse a shorter length of the uncompromised portion 170 of the waveguide than electromagnetic waves that travel through the entire length of the waveguide port. Therefore, the propagation loss associated with electromagnetic noise traversing the waveguide port exceeds the propagation loss of wireless signals transmitted or received by the wireless bridge device. In one example embodiment, the antenna 130 is located at or near the center of the uncompromised waveguide portion 170 (e.g. offset from center of the uncompromised longitudinal portion 170 by an amount less than 5%, 10%, 15%, 20% or 25% of length of the uncompromised longitudinal portion 170).

Figure 4A:
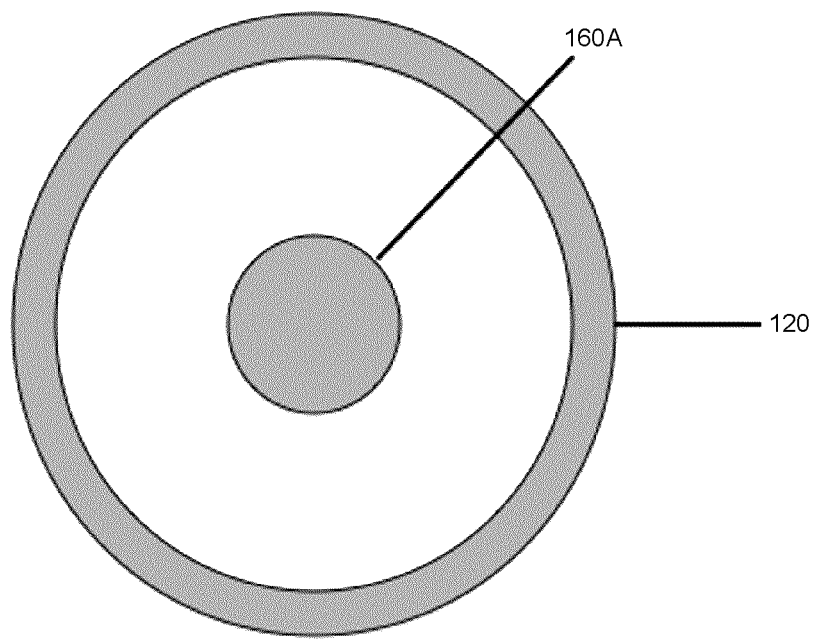
FIGS. 4A-4F illustrate various example embodiments in which a conductive feature is employed to provide a conductive path over a portion of the waveguide port.
Figure 4B:
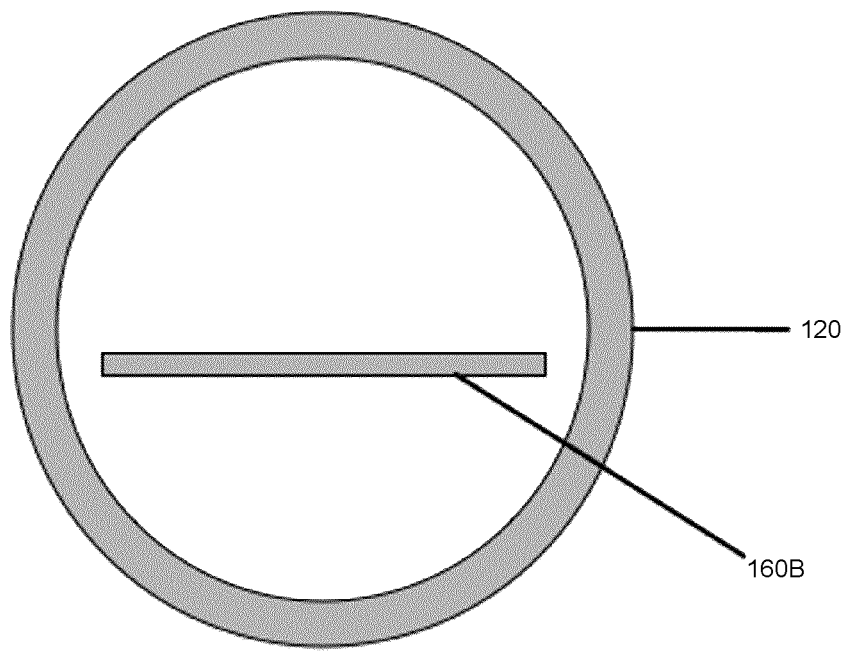

Referring now to FIGS. 4A-4F, several different example implementations are illustrated for compromising a longitudinal portion of the waveguide to support the propagation of electromagnetic waves. Without intending to be limited by theory, it is believed that the propagation of electromagnetic waves within the compromised portion of the waveguide port will be most efficient when the waveguide port and the conductor most resemble a coaxial configuration (e.g. such as in the case of a coaxial cable) where the conductor is located in, or near to the axial center of the waveguide (e.g. offset from the axial center of the waveguide by an amount less than 5%, 10%, 15%, 20% or 25% of waveguide diameter). An example implementation of such a configuration is shown in FIG. 4A, where conductor 160A is centrally located within the waveguide port 120. FIG. 4B illustrates an alternative implementation in which a planar (e.g. flat, rectangular) conductor is provided within the waveguide port.

Figure 4C:
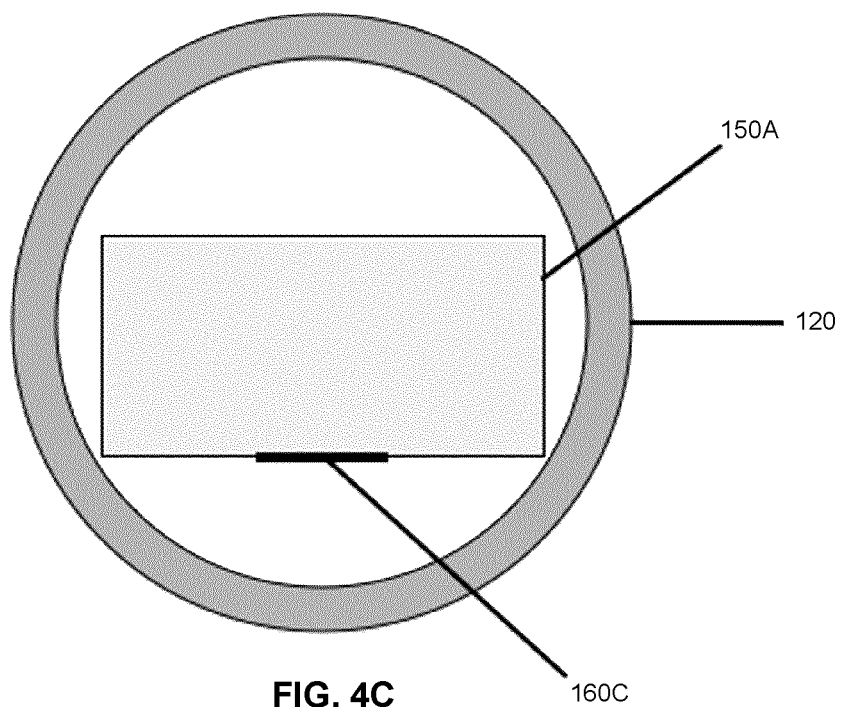

While FIGS. 4A and 4B illustrate the use of additional conductors that are provided in addition to the wireless bridge device (which is itself not shown in the figures), FIG. 4C shows an alternative example implementation in which the housing 150A of the wireless bridge device is formed from a non-conductive material, and where a conductive segment 160A (e.g. a wire, planar metallic strip, or foil) is located on the housing 150A, such that the conductive segment 160C does not electrically contact the waveguide port 120. Examples of a conductive strip include, but are not limited to, a rectangular piece of copper tape or other conductive tape. The strip may also consist of a rigid piece of copper or other conductive material affixed to the enclosure. Examples of other types of conductive materials include but are not limited to wires and cables. The conductive material could be affixed to the bottom face of the enclosure, as illustrated, or on any of the other outside faces. Alternatively, one or more conductive strips could be placed on any inside surface of the waveguide enclosure.

Figure 4D:
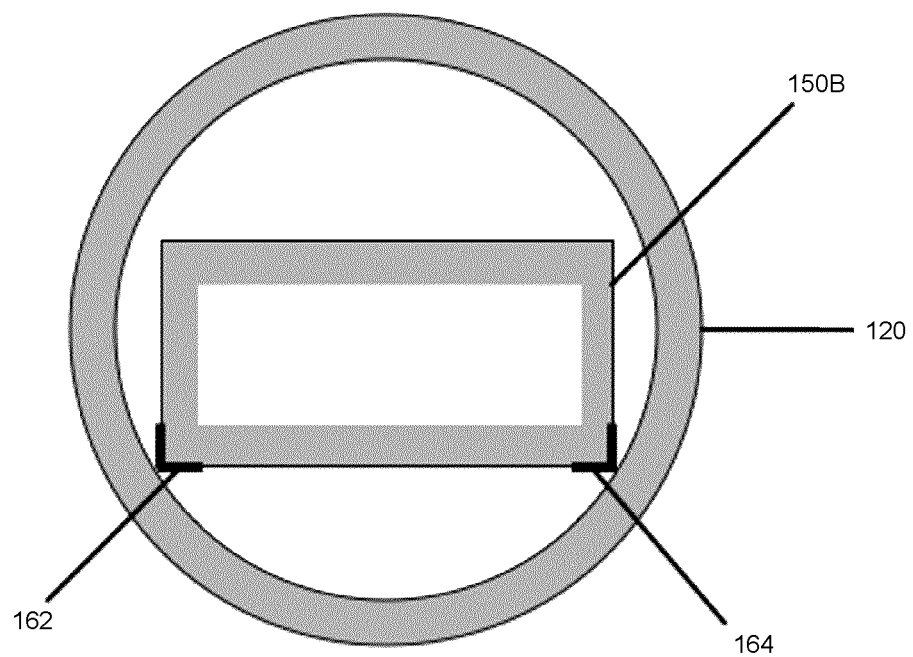

FIG. 4D illustrates an alternative example embodiment in which the housing 150B is electrically conductive and compromises the waveguide port 120, while remaining free from electrical contact with the waveguide port 120 due to the presence of dielectric spacers 162 and 164. The dielectric (insulating) material may consist, for example, of any material affixed to the enclosure that is non-conductive. The dielectric material may be placed at locations where the housing of the wireless bridge device would touch the inner surface of the waveguide in a typical operating configuration. Examples of non-conductive materials include but are not limited to electrical tape, polyimide (Kapton) tape, plastics, or epoxy layers.

Figure 4E:
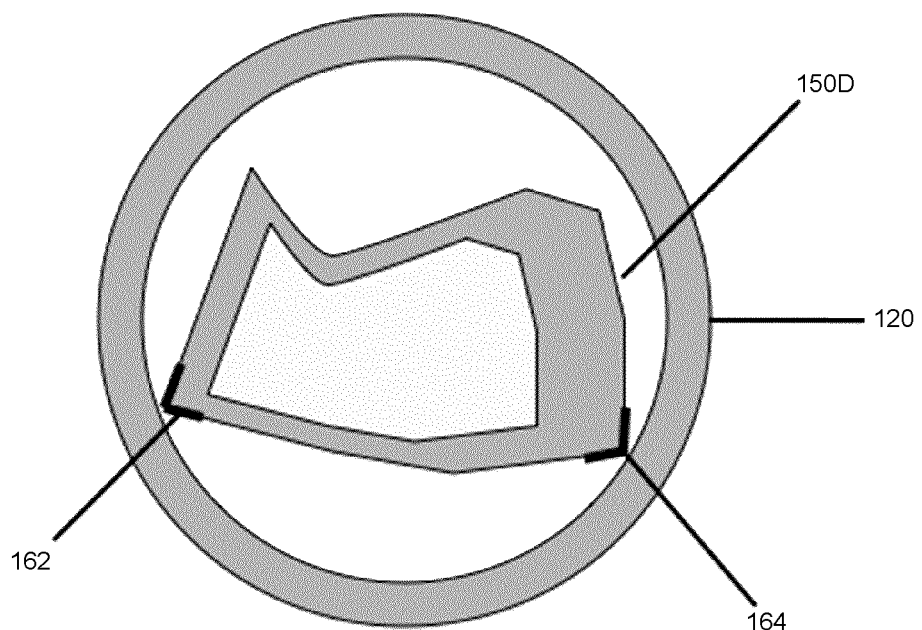
Figure 4F:
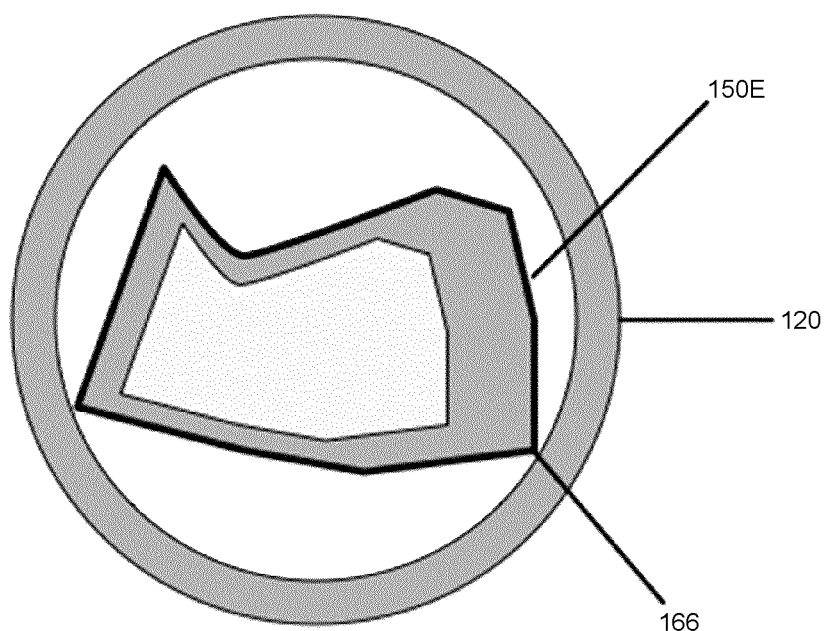

FIG. 4E illustrates another example embodiment showing an irregularly shaped housing 150D, while FIG. 4F illustrates an example embodiment in which the perimeter of the housing 150E is coated or otherwise enclosed by a dielectric material 166.

In other example implementations, one or more unshielded conductors provided within the wireless bridge device 150 may be suitable for compromising the waveguide to allow the propagation of electromagnetic waves. For example, a planar conductive layer in a printed circuit board within the wireless bridge device may be sufficient to compromise the waveguide, provided that the waveguide housing is not formed from a material that electrically shields the internal circuit board.

In some example embodiments, the wireless broadcast device 150 may wirelessly communicate with a communications control device 190, which may reside within the Faraday cage, or external to the Faraday cage. An example implementation is shown in FIG. 2A, where a communications control device 190 is shown residing within the control room. Communications control device 190 may include a wireless transceiver and antenna for supporting wireless communications with the wireless broadcast device 150. Communications control device 190 may also include, for example, a processor, a memory, a display, and one or more input devices (which may be a touch screen of the display) rendering a user interface that enables a user to configure and/or control, and optionally monitor, parameters of the communications system. In some example implementations, communications control device 190 may optionally performing signal routing, mixing, or other signal processing, in addition or in alternative to the signal processing performed by the wireless bridge device 130.

Figure 5A:
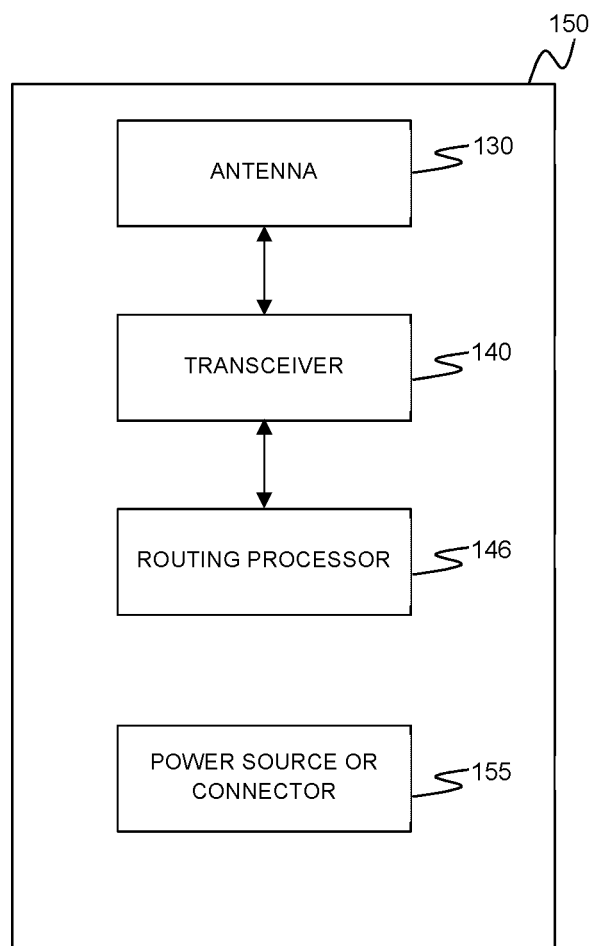
FIG. 5A illustrates the components of an example wireless bridge device.

FIG. 5A is a block diagram showing the components of an example implementation of the wireless communications device 150, which includes an antenna 130 in electrical communication with a wireless transceiver 140, where the wireless transceiver 140 is operably connected to a routing processor 146 that performs audio routing and audio mixing. A power source of power connector 155 is also provided to deliver power to the various electronic components.

Although FIG. 5A illustrates an example implementation with a single transceiver 140, other example implementations may employ multiple transceivers that operate at different frequencies to support multiplexed communication. Furthermore, although FIG. 5A illustrates an example implementation with a single antenna 130, other example implementations may employ multiple antennas that are configured to operate at different frequencies to support multiplexed communication. In one example embodiment, a plurality of antennas may be provided, where each antenna is connected to a separate transceiver.

In one example implementation, the communication of each wireless communication device with the other wireless communication devices is determined by a routing processor 146 housed inside the wireless bridge device. The wireless signals transmitted from each wireless communication device are received by the wireless bridge device via an array of N transceivers, where N is greater than or equal to 1. A transceiver is able to communicate with multiple wireless communication devices by ensuring that the wireless signals received from the various wireless communication devices are re-broadcasted to their respective targets. In the present example implementation, this is achieved using a method known as frequency hopping. The transceiver array in the wireless bridge device constantly receives transmissions over the air, sorts them according to their wireless communication device sources, and relays the signals through independent channels to the routing processor. The routing processor determines what to send back to each wireless communications device and outputs the signals in independent channels back to the transceiver array. For example, in an example intercom configuration, the signals received from a given wireless communication device are routed such that they are re-broadcasted to every wireless communications device other than itself. The transceiver array therefore encodes and re-broadcasts transmissions for the various wireless communications devices. Each wireless communication device employs its respective transceiver to decode the signals and determines its input signal.

In one example method, an assigned transmission band is divided into sub-bands. A paired transmitter/receiver follows a unique sub-band hopping pattern over time to communicate. This way, an over the air broadcast in the assigned frequency band can carry transmission for multiple receivers, each operating with different sub-band hopping patterns.

It will be understood that many different types of wireless protocols may be employed to encode and wirelessly transit signals. For example, one commonly used wireless protocol is the Bluetooth protocol. In a typical use, a Bluetooth master transceiver is paired to one or more slave transceivers. Wireless data is passed between the transceivers using digital packets. Bluetooth transmissions span the frequency band between 2402 and 2480 MHz. Bluetooth divides this band into 79 1-MHz sub-bands, and Bluetooth transmitters usually perform 1600 sub-band hops per second. Bluetooth is only one example of a wireless protocols. Others include, but are not limited to, Wi-Fi (802.11) and ZigBee (802.15.4).

An example of implementation of the headsets 125A-D will now be described. It is desirable for the headset to operate safely within the magnetic field of the MR scanner. Therefore, in the present example implementation, the materials forming at least the headsets 125A-B residing within the Faraday cage are non-ferromagnetic. In particular, the headsets 125A-B do not use conventional magnetic speakers, nor magnetic microphones; instead, they use piezoelectric speakers and piezoelectric contact microphones.

Figure 5B:
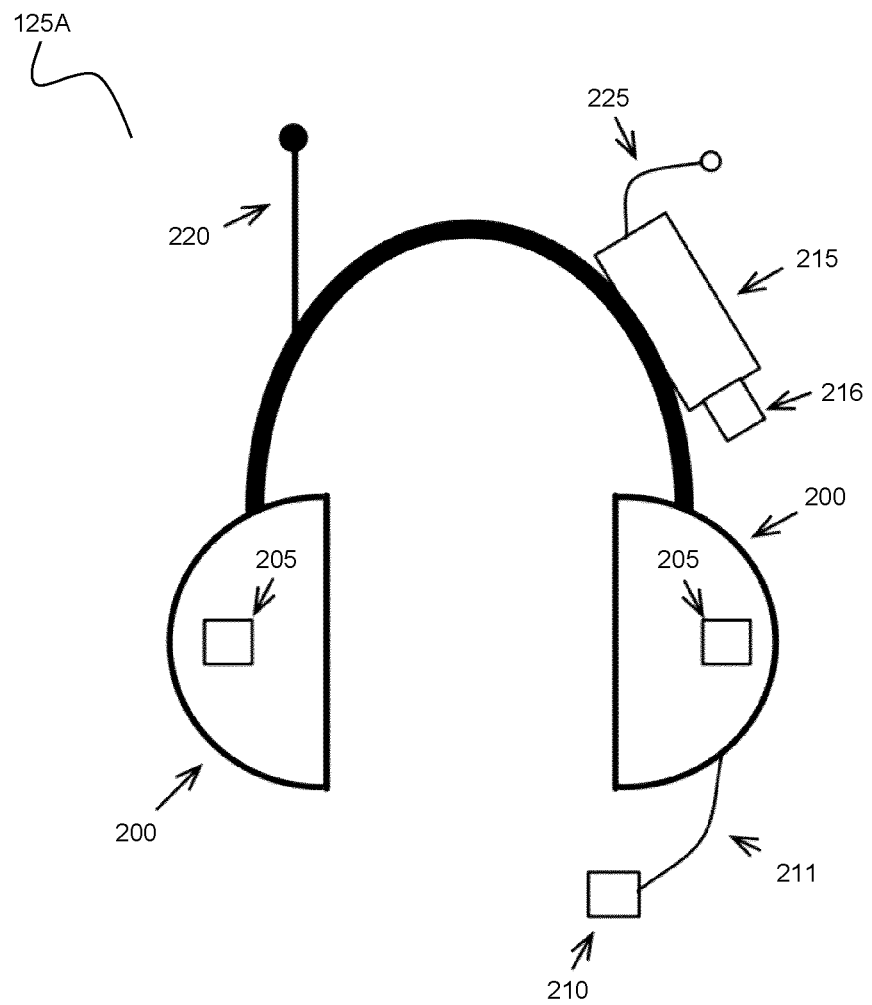
FIG. 5B illustrates an example audio communications device.

FIG. 5B is an illustration showing the components of an example headset 125A, which includes: at least one noise protection cavity 200 which fit over each ear of the user, at least one piezoelectric speaker 205 located inside one or each of the protection cavities for outputting audio signals to the user; at least one piezoelectric contact microphone 210 for receiving audio input signals from the user; and, headset control circuit 215 (including but not limited to at least one microprocessor); at least one conductor 211 connecting contact microphone 210 to the electronic components, at least one battery 216, at least one antenna 220. Headset 125A may include an electrical cable 225 for programming and facilitating the operation of the previously described components of headset 125A.

Although the wireless communication devices employed in the preceding example embodiments are audio communications devices, it will be understood that these example implementation are intended to be non-limiting, and that a wide variety of wireless devices can be employed according to the present disclosure. For example, any one or more of the wireless communications device may be a mobile computing device equipped with a wireless transceiver, such as, but not limited to, a smartphone, laptop or tablet computing device. Moreover, the signals that are transmitted among the wireless communications device may be employed to encode various different types of communications, including, but not limited to, audio, text or email messages, data, and video.

Although many of the preceding example embodiments described configurations in which the uncompromised longitudinal portion of the waveguide lies on the magnet room side of the waveguide port, and the compromised longitudinal portion of the waveguide port lies on the control room side of the waveguide port, it will be understood that these are merely example configurations. In other example configurations, the uncompromised longitudinal portion of the waveguide may be adjacent to the control room side of the waveguide port, and the compromised longitudinal portion of the waveguide port may be adjacent to the magnet room side of the waveguide port.

In another example embodiment, a system may be provided in which the wireless transmission frequency of the wireless communication devices is above the cutoff frequency of the waveguide port. In such a case, the antenna may be located within the waveguide port at any suitable location, without compromising the waveguide port, since TE and/or TM modes exist in the waveguide for the transmission of wireless signals. For example, the example embodiment shown in FIG. 2 may be modified, when the wireless frequency is above the waveguide port cutoff frequency, by ensuring that any external conductors of the wireless bridge device 150 are in electrical contact with the waveguide port, thus preserving the operation of the waveguide port as a high-pass filter. It is noted that such embodiments are different from those disclosed in Patent Cooperation Treaty Patent Application No. PCT/CA2014/050086 because none of the embodiments disclosed by Patent Cooperation Treaty Patent Application No. PCT/CA2014/050086 involve the use of an antenna to transmit and receive wireless signals both inside of, and outside of, the Faraday cage.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A wireless communication system for communicating through a waveguide port of a Faraday cage, the wireless communications system comprising:
  an internal wireless device located within the Faraday cage;
  an external wireless device located external to the Faraday cage, said internal wireless device and said external wireless device being configured for wireless communication within a frequency band that lies, at least in part, above a cutoff frequency of said waveguide port; and
  a wireless bridge device comprising an antenna and a transceiver, said transceiver being operably connected to said antenna, said antenna residing within an internal region of said waveguide port;
  said wireless bridge device being configured to (i) receive, with said antenna, first wireless signals from one of said internal wireless device and said external wireless device, said first wireless signals residing within said frequency band and propagating within said waveguide port as one or both of transverse electric (TE) and transverse magnetic (TM) modes, and (ii) transmit, from said antenna, second wireless signals to the other of said internal wireless device and said external wireless device, said second wireless signals residing within said frequency band and propagating within said waveguide port as one or both as TE and TM waves;
  said wireless bridge device thereby being configured to facilitate wireless communication between said internal wireless device and said external wireless device, through said waveguide port, via wireless signal reception by said antenna and wireless signal re-transmission by said antenna.

2. The wireless communication system according to claim 1 wherein any external electrical conductors that are associated with a portion of said wireless bridge device and reside within said waveguide port are in electrical communication with said waveguide port, thus preserving the operation of said waveguide port as a high-pass filter.

3. The wireless communication system according to claim 1 wherein said transceiver is located outside of said waveguide port.

4. The wireless communication system according to claim 1 wherein the cutoff frequency of said waveguide port is above 2.4 GHz.

5. The wireless communication system according to claim 1 wherein the cutoff frequency of said waveguide port is 3.46 GHz.

6. The wireless communication system according to claim 1 wherein said wireless bridge device comprises one or more additional antennae operably connected to said transceiver.

7. The wireless communication system according to claim 1 wherein said internal wireless device is a first internal wireless device, said wireless communication system further comprising an additional internal wireless device, wherein said wireless bridge device is configured to facilitate wireless communication between said first internal wireless device and said additional internal wireless device.

8. The wireless communication system according to claim 1 wherein said external wireless device is a first external wireless device, said wireless communication system further comprising an additional external wireless device, wherein said wireless bridge device is configured to facilitate wireless communication between said first external wireless device and said additional external wireless device.

9. A method of performing wireless communication through a waveguide port of a Faraday cage, the method comprising:
  providing a wireless bridge device comprising an antenna and a transceiver, the transceiver being operably connected to the antenna;
  positioning the antenna such that the antenna resides within an internal region of the waveguide port; and
  employing the wireless bridge device to:
    receive, with the antenna, first wireless signals from one of an internal wireless device located within the Faraday cage and an external wireless device located external to the Faraday cage, the first wireless signals propagating within the waveguide port as one or both of transverse electric (TE) and transverse magnetic (TM) modes and residing within a frequency band that resides, at least in part, above a cutoff frequency of the waveguide port; and
    transmit, from the antenna, second wireless signals to the other of the internal wireless device and the external wireless device, such that the second wireless signals reside within the frequency band and propagate within the waveguide port as one or both as TE and TM waves;
  thereby facilitating wireless communication between the internal wireless device and the external wireless device, through the waveguide port, via wireless signal reception by the antenna and wireless signal re-transmission by the antenna.

\* \* \* \* \*